(12) United States Patent
Azumi

(10) Patent No.: US 10,720,398 B2
(45) Date of Patent: Jul. 21, 2020

(54) ANISOTROPIC CONDUCTIVE SHEET AND METHOD FOR MANUFACTURING THE SAME

(71) Applicant: ENPLAS CORPORATION, Kawaguchi-shi, Saitama (JP)

(72) Inventor: Leo Azumi, Kawaguchi (JP)

(73) Assignee: ENPLAS CORPORATION, Saitama (JP)

(*) Notice: Subject to any disclaimer, the term of this patent is extended or adjusted under 35 U.S.C. 154(b) by 0 days.

(21) Appl. No.: 16/341,308

(22) PCT Filed: Oct. 26, 2017

(86) PCT No.: PCT/JP2017/038704
§ 371 (c)(1),
(2) Date: Apr. 11, 2019

(87) PCT Pub. No.: WO2018/079655
PCT Pub. Date: May 3, 2018

(65) Prior Publication Data
US 2020/0051931 A1    Feb. 13, 2020

(30) Foreign Application Priority Data
Oct. 27, 2016  (JP) .................... 2016-210695

(51) Int. Cl.
| H01L 23/58 | (2006.01) |
| H01L 23/50 | (2006.01) |
| H01R 13/24 | (2006.01) |
| H01R 43/00 | (2006.01) |

(52) U.S. Cl.
CPC ............ *H01L 23/585* (2013.01); *H01L 23/50* (2013.01); *H01R 13/2414* (2013.01); *H01R 43/007* (2013.01); *H05K 2201/0133* (2013.01)

(58) Field of Classification Search
CPC .................................................. H01R 13/2414
(Continued)

(56) References Cited

U.S. PATENT DOCUMENTS

| 4,209,481 A | * | 6/1980 | Kashiro | ................. B29C 70/14 264/108 |
| 5,385,477 A | * | 1/1995 | Vaynkof | ............ G01R 1/07357 439/591 |

(Continued)

FOREIGN PATENT DOCUMENTS

| JP | 3-196416 | 8/1991 |
| JP | 2001-322139 | 11/2001 |

(Continued)

OTHER PUBLICATIONS

International Search Report dated Jan. 23, 2018, in corresponding International Patent Application No. PCT/JP2017/038704.

(Continued)

*Primary Examiner* — Ross N Gushi
(74) *Attorney, Agent, or Firm* — Staas & Hasley LLP

(57) ABSTRACT

An anisotropic conductive sheet including: a sheet body including a material having an insulation property; and a plurality of conductive portions each including a material having a conductive property, each of the plurality of conductive portions being provided so as to penetrate one surface side and another surface side of the sheet body is provided. Each of the plurality of conductive portions includes a plurality of conductive fibrous members. In the plurality of conductive fibrous members in the conductive portion, a longitudinal direction (Q) of each conductive fibrous member is along a direction that is substantially same as a penetration direction (P) of the penetration between the one surface side and the other surface side and the conductive fibrous members are in contact with one (Continued)

another, providing electrical connection from the one surface side toward the other surface side.

6 Claims, 17 Drawing Sheets

(58) Field of Classification Search
USPC .................................................. 439/66, 91
See application file for complete search history.

(56) References Cited

U.S. PATENT DOCUMENTS

| | | | | |
|---|---|---|---|---|
| 5,441,690 | A * | 8/1995 | Ayala-Esquilin | H01B 3/46 156/155 |
| 6,011,307 | A * | 1/2000 | Jiang | H01L 23/49827 257/741 |
| 6,168,442 | B1 * | 1/2001 | Naoi | H01R 13/2414 439/66 |
| 6,264,476 | B1 * | 7/2001 | Li | H01R 13/2414 439/66 |
| 6,465,084 | B1 * | 10/2002 | Curcio | H05K 3/462 174/255 |
| 6,604,953 | B2 * | 8/2003 | Igarashi | G01R 1/07307 439/70 |
| 6,645,607 | B2 * | 11/2003 | Curcio | H05K 3/462 174/259 |
| 6,690,564 | B1 * | 2/2004 | Haruta | H01R 43/007 361/212 |
| 6,712,620 | B1 * | 3/2004 | Li | H01R 12/714 439/394 |
| 6,720,787 | B2 * | 4/2004 | Kimura | H01R 13/2414 29/884 |
| 6,849,335 | B2 * | 2/2005 | Igarashi | H01B 1/20 361/100 |
| 6,854,985 | B1 * | 2/2005 | Weiss | H01R 13/2414 439/591 |
| 6,870,385 | B2 * | 3/2005 | Inoue | G01R 1/06755 324/755.09 |
| 6,969,622 | B1 * | 11/2005 | Kokubo | H01R 13/2414 324/750.05 |
| 7,014,479 | B2 * | 3/2006 | Li | H01L 23/49811 257/E23.067 |
| 7,029,288 | B2 * | 4/2006 | Li | H01L 21/486 257/E23.067 |
| 7,040,902 | B2 * | 5/2006 | Li | H01R 13/2407 257/E23.067 |
| 7,049,836 | B2 * | 5/2006 | Setaka | G01R 1/07314 257/E23.067 |
| 7,095,241 | B2 * | 8/2006 | Setaka | G01R 1/06711 324/755.05 |
| 7,160,123 | B2 * | 1/2007 | Yamada | G01R 1/0416 264/108 |
| 7,190,180 | B2 * | 3/2007 | Yamada | H01R 11/01 29/744 |
| 7,255,579 | B2 * | 8/2007 | Sato | G01R 1/0735 257/E23.067 |
| 7,297,004 | B1 * | 11/2007 | Shuhart | H01R 13/2421 439/66 |
| 7,309,244 | B2 * | 12/2007 | Yamada | G01R 1/06755 439/591 |
| 7,311,531 | B2 * | 12/2007 | Igarashi | G01R 1/0735 257/E23.067 |
| 7,323,712 | B2 * | 1/2008 | Kokubo | H01R 13/2414 257/48 |
| 7,384,279 | B2 * | 6/2008 | Igarashi | G01R 1/0735 439/66 |
| 7,402,051 | B1 * | 7/2008 | Batish | H01R 12/52 439/66 |
| 7,690,932 | B2 * | 4/2010 | Nakaone | H01R 12/57 257/773 |
| 7,705,618 | B2 * | 4/2010 | Kimura | G01R 1/07378 324/755.08 |
| 7,833,020 | B1 * | 11/2010 | Ma | H01R 13/2407 439/66 |
| 7,922,497 | B2 * | 4/2011 | Yamada | G01R 1/0735 439/66 |
| 8,093,970 | B2 * | 1/2012 | Li | H01H 1/5822 335/127 |
| 8,124,885 | B2 * | 2/2012 | Yamada | H01R 12/7082 174/262 |
| 8,419,448 | B2 * | 4/2013 | Konno | H01R 43/007 29/883 |
| 8,435,044 | B2 * | 5/2013 | Balucani | G01R 1/06716 439/66 |
| 8,870,579 | B1 * | 10/2014 | Weiss | H05K 3/32 324/755.08 |
| 9,160,094 | B2 * | 10/2015 | Yamada | H01R 13/2414 |
| 9,651,522 | B2 * | 5/2017 | Colladon | G01N 27/72 |
| 9,653,832 | B2 * | 5/2017 | Higashitani | H01R 13/2407 |
| 2001/0024735 | A1 | 9/2001 | Kuhlmann-Wilsdorf | H01R 39/22 428/611 |
| 2001/0049208 | A1 * | 12/2001 | Igarashi | G01R 1/07307 439/68 |
| 2004/0028893 | A1 * | 2/2004 | Inoue | G01R 1/06755 428/328 |
| 2004/0049914 | A1 * | 3/2004 | Wang | H01R 12/714 29/884 |
| 2005/0017369 | A1 * | 1/2005 | Clayton | H01L 23/49827 257/774 |
| 2005/0106907 | A1 * | 5/2005 | Yamada | G01R 1/0416 439/91 |
| 2005/0258850 | A1 * | 11/2005 | Yamada | H01R 11/01 324/755.08 |
| 2005/0272282 | A1 * | 12/2005 | Setaka | G01R 1/06755 439/86 |
| 2006/0154500 | A1 * | 7/2006 | Igarashi | G01R 1/0735 439/86 |
| 2006/0162287 | A1 * | 7/2006 | Hasegawa | H01R 11/01 53/362 |
| 2006/0177971 | A1 * | 8/2006 | Kokubo | H01L 21/486 438/119 |
| 2006/0189176 | A1 * | 8/2006 | Li | H01R 13/2407 439/66 |
| 2006/0211276 | A1 * | 9/2006 | Li | H01R 13/2407 439/66 |
| 2006/0280912 | A1 * | 12/2006 | Liang | H01B 1/22 428/173 |
| 2007/0040245 | A1 * | 2/2007 | Seno | H01R 43/007 257/666 |
| 2007/0224847 | A1 * | 9/2007 | Umezawa | H01R 13/2414 439/66 |
| 2009/0053859 | A1 * | 2/2009 | Xu | H01B 1/22 438/118 |
| 2011/0043239 | A1 * | 2/2011 | Tomita | G01R 1/0735 324/756.03 |
| 2013/0092426 | A1 * | 4/2013 | Wu | H01L 24/29 174/257 |
| 2019/0237214 | A1 * | 8/2019 | Ishimatsu | H01B 1/22 |

FOREIGN PATENT DOCUMENTS

| | | |
|---|---|---|
| JP | 2003-257542 | 9/2003 |
| JP | 3123971 | 7/2006 |
| JP | 2008-58286 | 3/2008 |
| JP | 2010-43256 | 2/2010 |
| WO | WO 2011/027692 A1 | 3/2011 |

OTHER PUBLICATIONS

International Written Opinion dated Jan. 23, 2018, in corresponding International Patent Application No. PCT/JP2017/038704.

* cited by examiner

ANISOTROPIC CONDUCTIVE SHEET AND METHOD FOR MANUFACTURING THE SAME

CROSS-REFERENCE TO RELATED APPLICATION

This application is a U.S. National Stage Application which claims the benefit under 35 U.S.C. § 371 of PCT International Patent Application No. PCT/JP2017/038704, filed, Oct. 26, 2017, which claims the foreign priority benefit under 35 U.S.C. § 119 of Japanese Patent Application No. 2016-210695, filed Oct. 27, 2016, the contents of which are incorporated herein by reference.

TECHNICAL FIELD

This invention relates to an anisotropic conductive sheet to be used for, e.g., a test of an electric component such as a semiconductor device (hereinafter referred to as "IC package") and a method for manufacturing the same.

BACKGROUND ART

Conventionally, there are anisotropic conductive sheets that in, e.g., a test of an IC package, which is an "electric component", receive the IC package and electrically connect the IC package to, e.g., a wiring substrate.

Although such anisotropic conductive sheets each include a plurality of conductive portions each having a conductive property, the conductive portions being provided in a sheet body having an insulation property, but the conductive portions often each include a plurality of metal grains (see Patent Literature 1).

CITATION LIST

Patent Literature

Patent Literature 1: Japanese Patent Laid-Open No. 3-196416

SUMMARY

Technical Problem

However, conventionally, as in FIG. 14 conceptually illustrating the aforementioned configuration in Patent Literature 1, conductive portions 130 provided in a sheet body 120 of an anisotropic conductive sheet 110 each include a plurality of metal grains 131, and thus, in each conductive portion 130, one surface side 121 of the sheet body 20, which terminals 3 of an IC package 1 contact with, and another surface side 122 of the sheet body 20, which contacts 8 of a substrate 6 contact with, need to be electrically connected through many contact points Z between metal grains 131. As a result, the problem of high electrical resistance occurs.

Therefore, an object of this invention is to provide an anisotropic conductive sheet that enables electrical resistance from one surface side to another surface side of each conductive portion to be suppressed to be low by a simple structure and a method for manufacturing the same.

Solution to Problem

In order to achieve the object, the invention according to claim 1 provides an anisotropic conductive sheet including: a sheet body including a material having an insulation property; and a plurality of conductive portions each including a material having a conductive property, each of the plurality of conductive portions being provided so as to penetrate one surface side and another surface side of the sheet body, wherein each of the plurality of conductive portions includes a plurality of conductive fibrous members, and in the plurality of conductive fibrous members in the conductive portion, a longitudinal direction of each conductive fibrous member is along a direction that is substantially same as a penetration direction of the penetration between the one surface side and the other surface side and the conductive fibrous members are in contact with one another, providing electrical connection from the one surface side toward the other surface side.

Also, the invention according to claim 2 provides the anisotropic conductive sheet of the invention according to claim 1, wherein: a plurality of hole portions penetrating from the one surface side to the other surface side is provided in the sheet body; and the conductive portions are provided in the respective hole portions.

Also, the invention according to claim 3 provides the anisotropic conductive sheet of the invention according to claim 2, wherein the conductive fibrous members are formed in such a manner that a length in the longitudinal direction of each of the conductive fibrous members is longer than a diameter of each of the hole portions.

Also, the invention according to claim 4 provides the anisotropic conductive sheet of the invention according to any one of claims 1 to 3, wherein the plurality of conductive fibrous members that are in contact with one another in each conductive portion are held by a member having an elastic force and forms an elastic body and the conduction portion thereby has an elastic force in the penetration direction.

Also, the invention according to claim 5 provides a method for manufacturing the anisotropic conductive sheet according to any one of claims 1 to 3, the method including: embedding a plurality of conductive fibrous members in each of liquid portions that are to be a plurality of conductive portions each penetrating one surface side and another surface side of a sheet body including a material having an insulation property; applying a magnetic force in a penetration direction of the penetration between the one surface side and the other surface side to cause a longitudinal direction of each of the plurality of the conductive fibrous members to be directed to the penetration direction by the magnetic force and cause the plurality of conductive fibrous members to be brought into contact with one another by the magnetic force; and curing the liquid portions.

Advantageous Effects of Invention

In the invention according to claim 1, each of the plurality of conductive portions in the anisotropic conductive sheet includes the plurality of conductive fibrous members, and in the plurality of conductive fibrous members in the conductive portion, the longitudinal direction of each conductive fibrous member is along a direction that is substantially same as the penetration direction of the penetration between the one surface side and the other surface side of the sheet body and the conductive fibrous members are in contact with one another, providing electrical connection from the one surface side to the other surface side, enabling the number of contact points between the conductive fibrous members when the one surface side and the other surface side are electrically connected, to be suppressed to be small. As a result, electrical resistance from the one surface side to the other surface side of each conductive portion can be suppressed to be low.

In the invention according to claim 2, the plurality of conductive fibrous members are inserted in each of the plurality of hole portions provided in the sheet body and form a conductive portion, and thus, the conductive portions with electrical resistance suppressed to be low can be provided by the simple configuration.

In the invention according to claim 3, the length in the longitudinal direction of each conductive fibrous member is longer than the diameter of each hole portion, enabling prevention of the trouble of the conductive fibrous members falling down sideways in each hole portion and the longitudinal directions of the conductive fibrous members failing to be directed to the penetration direction of each hole portion. As a result, the longitudinal directions of the conductive fibrous members are reliably directed to the penetration direction of the hole portion, enabling the number of contact points between the conductive fibrous members between the one surface side and the other surface side to be suppressed to be low.

In the invention according to claim 4, the plurality of conductive fibrous members that are in contact with one another are encased and thereby held by the member having an elastic force and form an elastic body having an elastic force in the penetration direction, thereby forming a conductive portion, and thus, contact pressure between the conductive portions, and an electric component and a substrate can be secured.

In the invention according to claim 5, in the method for manufacturing the anisotropic conductive sheet, as a result of a magnetic force being applied in the penetration direction of the penetration between the one surface side and the other surface side of the sheet body with the plurality of conductive fibrous members embedded therein, the conductive fibrous members can easily extend along a magnetic force line by means of the magnetic force and the conductive fibrous members can easily be brought into close contact with one another by the magnetic force, facilitating shaping of the conductive portions.

DESCRIPTION OF EMBODIMENT

An embodiment of this invention will be described below.

FIGS. 1 to 13 illustrates an embodiment of this invention.

Figure 1:
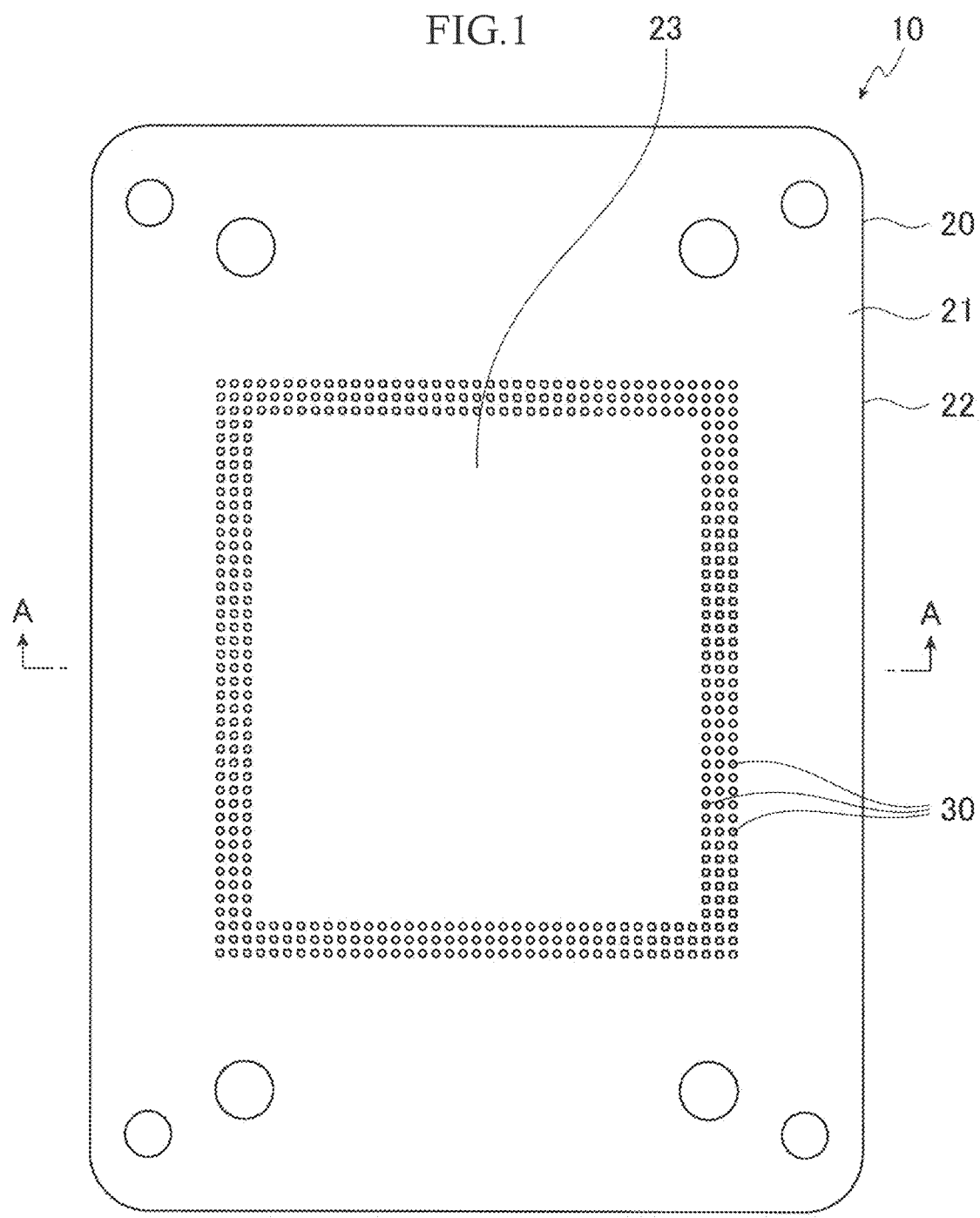
FIG. 1 is a plan view of an anisotropic conductive sheet according to an embodiment of this invention.
Figure 2:
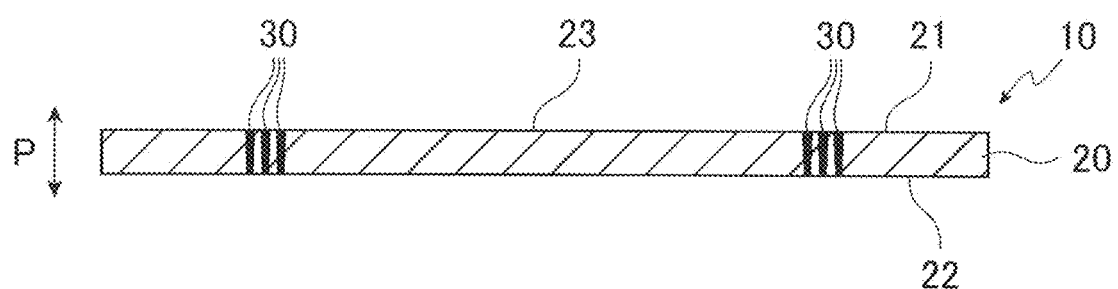
FIG. 2 is a cross-sectional view of the anisotropic conductive sheet according to the embodiment along line A-A in FIG. 1.
Figure 13:
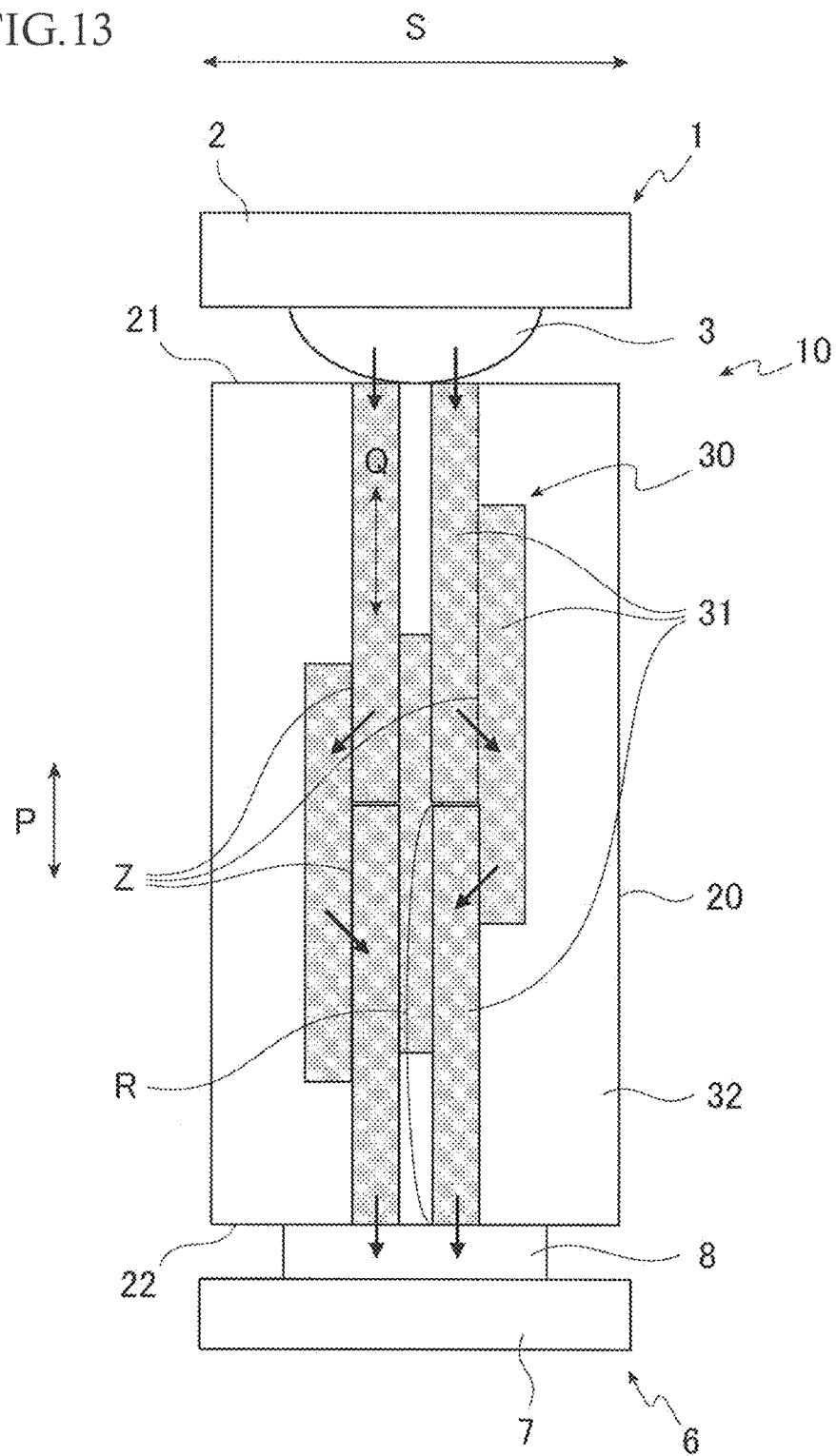
FIG. 13 is a cross-sectional view illustrating a state of contact points between conductive fibrous members in the anisotropic conductive sheet according to the embodiment.

First, a configuration will be described. As illustrated in FIG. 13, an anisotropic conductive sheet 10 according to this embodiment is intended to receive an IC package 1, which is an "electric component", and be placed on a substrate 6 to conduct, e.g., a test, and as illustrated in FIGS. 1 and 2, has a configuration in which a plurality of conductive portions 30 are provided in a sheet body 20.

First, the IC package 1 and the substrate 6 will be described. As illustrated in FIG. 13, the IC package 1 of this embodiment is one that is what is called "BGA", and includes a package body 2 having a substantially square shape in plan view, and a plurality of semispherical terminals 3 formed on a lower surface of the package body 2 so as to project downward. Also, the substrate 6 of the embodiment includes contacts 8 each having a substantially flat plate-like shape at respective positions in a substrate body 7, the positions corresponding to those of the terminals 3 of the IC package 1, respectively. Note that the shape of each terminal 3 is not limited to a semispherical shape but may be an arbitrary shape such as a substantially flat plate-like shape. Also, the shape of each contact 8 is not limited to a substantially flat plate-like shape but may be another shape.

Also, the sheet body 20 of the anisotropic conductive sheet 10 is formed of a material having an insulation property and flexibility (here, silicone rubber) and is formed in a substantially quadrate thin plate shape. Also, a substantially center portion of one surface side 21 of the sheet body 20 is a receiving portion 23 that receives the IC package 1 (see FIG. 13) that is a test subject and a plurality of conductive portions 30 are formed at a predetermined position in the receiving portion 23 (here, a position corresponding to a quadrangular frame-like part of the received IC package 1).

Figure 3:
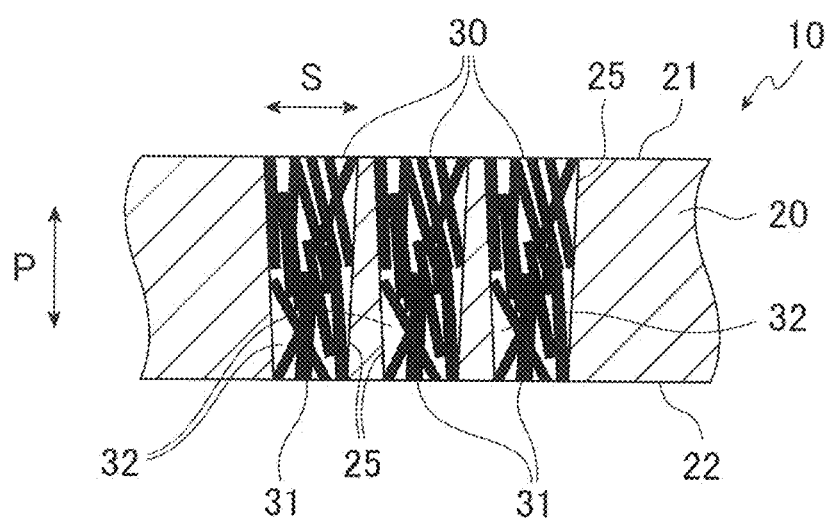
FIG. 3 is an enlarged cross-sectional view of conductive portions in the anisotropic conductive sheet according to the embodiment.

Also, the substrate 6 (see FIG. 13) is disposed on a substantially center portion of another surface side 22 opposite the one surface side 21 of the sheet body 20. Also, as illustrated in FIG. 3, a plurality of hole portions 25 penetrating the one surface side 21 and the other surface side 22 are provided at a predetermined position in the aforementioned receiving portion 23 of the sheet body 20, and the conductive portions 30 penetrating the one surface side 21 and the other surface side 22 of the sheet body 20 are formed by putting a plurality of conductive fibrous members 31 into each of the hole portions 25.

The conductive portions 30 will be described in detail below. As illustrated in FIG. 3, in each of the conductive portions 30, a plurality of substantially linear conductive fibrous members 31 formed of a predetermined conductive material such as nickel are inserted in each hole portion 25 so as to be in contact with one another and the conductive fibrous members 31 that are in contact with one another are held by a resin 32 (for example, a silicone resin), which is a member having an elastic force. Here, a length R in a longitudinal direction Q of each conductive fibrous member 31 is approximately 0.2 mm, a fiber diameter of each conductive fibrous member 31 is approximately 20 μm and a diameter S of each hole portion 25 is approximately 0.17 mm. Also, the conductive fibrous members 31 are inserted in each hole portion 25 in such a manner that the longitudinal directions Q of the conductive fibrous members 31 are directed to a direction that is substantially the same as a penetration direction P of penetration between the one surface side 21 and the other surface side 22 of the sheet body 20, and in such state, the conductive fibrous members 31 inserted in the hole portion 25 are in contact with one another.

Also, as a result of the resin 32 being of, e.g., a silicone resin and having an elastic force and the sheet body 20 being of, e.g., silicone rubber and having an elastic force, the conductive fibrous members 31 bends so as to follow elastic deformation of the silicone resin and the silicone rubber, causing the conductive portion 30 to have an elastic force in the penetration direction P and perform predetermined elastic deformation against pressure in the penetration direction P.

Also, as described above, the length R in the longitudinal direction Q each conductive fibrous members 31 is longer than the diameter S of each hole portion 25 of the sheet body 20. Consequently, when the conductive fibrous members 31 are put in each hole portion 25, the conductive fibrous members 31 do not completely fall down sideways in the hole portion 25 but are disposed in such as a manner that the conductive fibrous members are obliquely inserted at least at a certain angle.

Next, a method for manufacturing the anisotropic conductive sheet 10 according to this embodiment will be described with reference to FIGS. 4 to 12. Note that the part of the method for manufacturing the anisotropic conductive sheet 10 other than the below-described process of forming conductive portions 30 is the same as a conventional manufacturing method and description thereof will be omitted.

Figure 4:
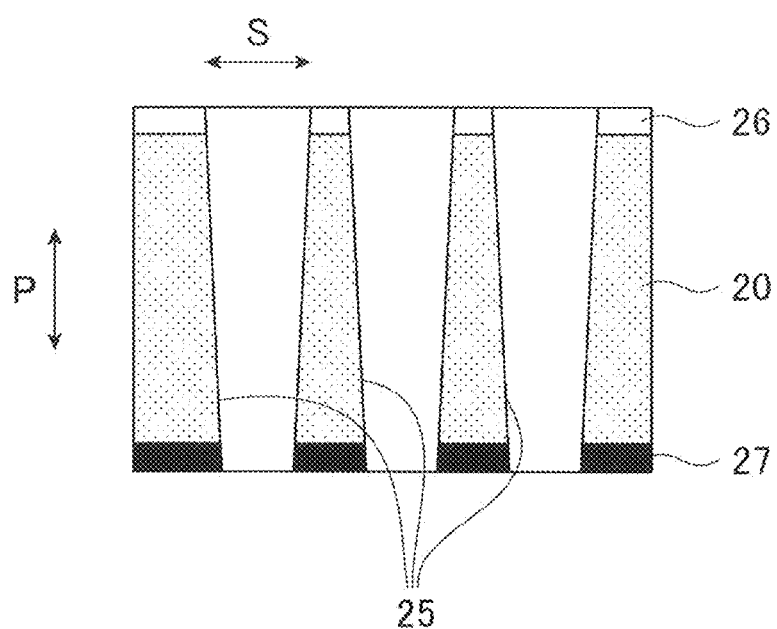
FIG. 4 is a cross-sectional view illustrating a process of manufacturing the anisotropic conductive sheet according to the embodiment.

First, as illustrated in FIG. 4, a resin film 26 of, e.g., PET is attached to one surface side 21 (here, an upper surface side) of a sheet body 20 formed of a resin having an elastic force such as silicone, a resin film 27 such as polyimide is attached to another surface side 22 (here, a lower surface side) of the sheet body 20 and hole portions 25 penetrating from the one surface side 21 to the other surface side 22 are provided at a predetermined position by means of, e.g., laser processing. At this time, each of the hole portions 25 is formed so that an opening of the one surface side 21, which is the upper surface side, is wide and an opening of the other surface side 22, which is the lower surface side, is narrow, and consequently, the conductive fibrous members 31 can easily be inserted and the conductive fibrous members 31 do not easily lie sideways on the lower side of the hole portion 25.

Figure 5:
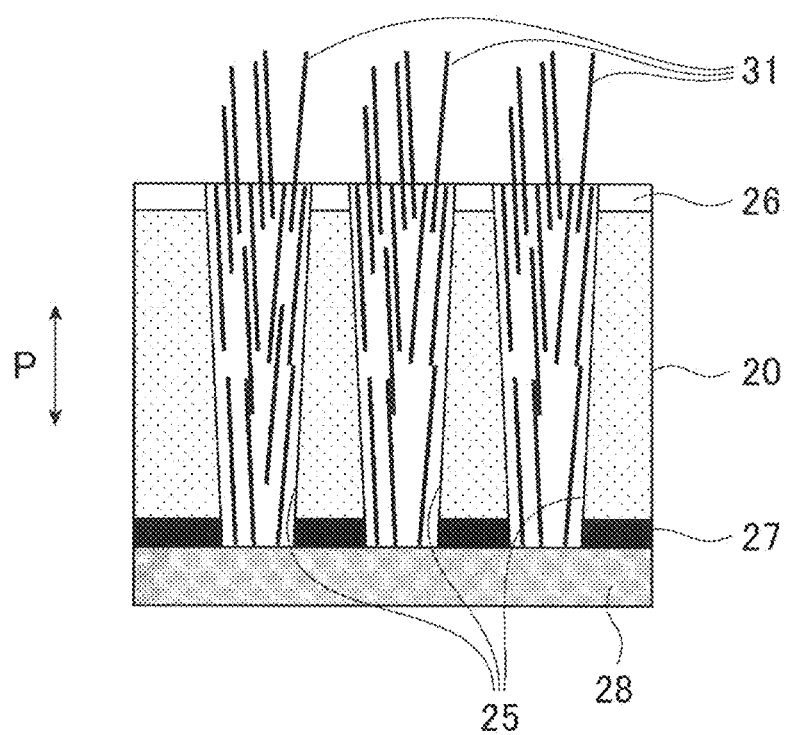
FIG. 5 is a cross-sectional view illustrating the process of manufacturing the anisotropic conductive sheet according to the embodiment.

Next, as illustrated in FIG. 5, the sheet body 20 in the state in FIG. 4 is disposed and fixed on an adhesive sheet 28 formed of, e.g., polyimide, PET or polyethylene and conductive fibrous members 31 are poured into each of the hole portions 25 from the one surface side 21. At this time, a length R in a longitudinal direction Q of each conductive fibrous member 31 is longer than a diameter S of each hole portion 25, and thus the conductive fibrous members 31 do not completely fall down sideways in each hole portion 25 but obliquely inserted in the hole portion 25 at least at a certain angle.

Figure 6:
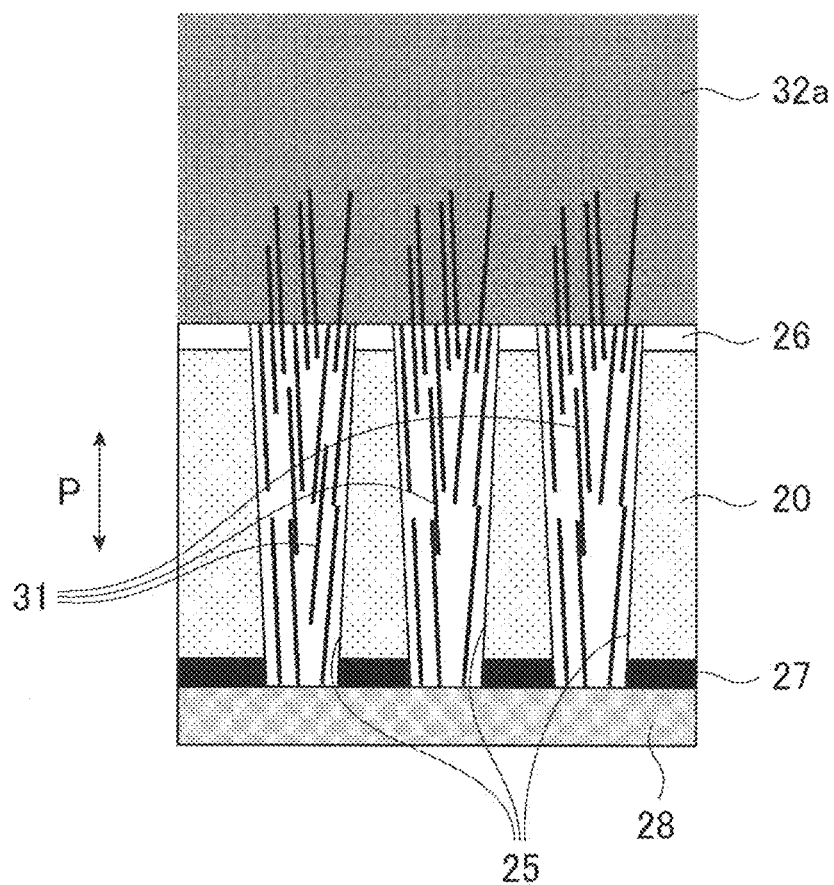
FIG. 6 is a cross-sectional view illustrating the process of manufacturing the anisotropic conductive sheet according to the embodiment.
Figure 7:
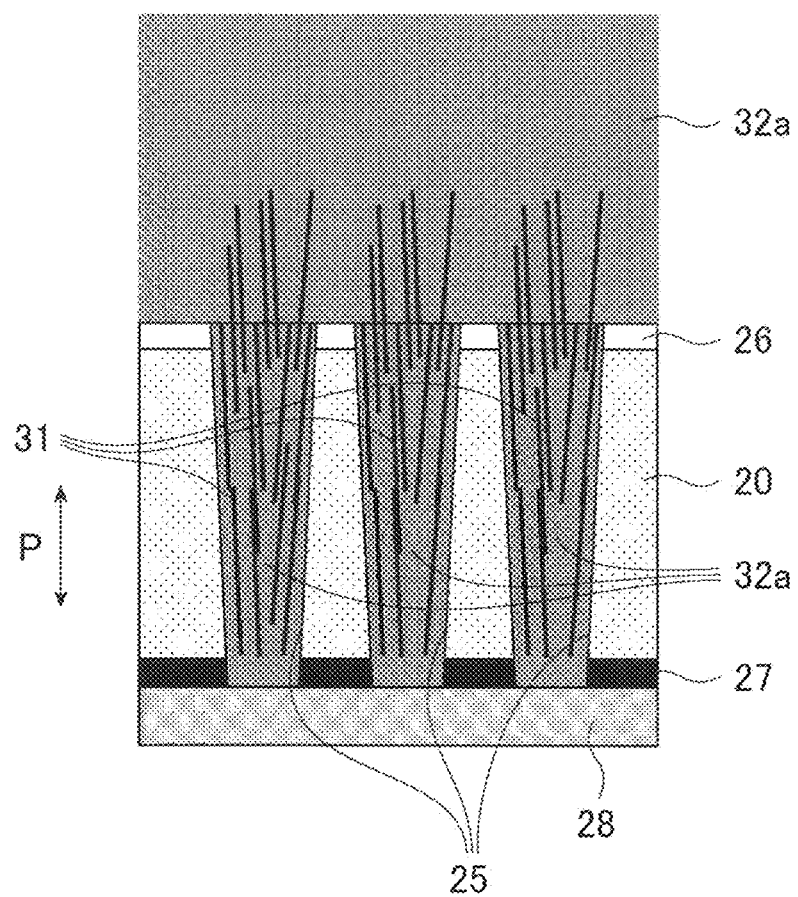
FIG. 7 is a cross-sectional view illustrating the process of manufacturing the anisotropic conductive sheet according to the embodiment.

Next, as illustrated in FIG. 6, liquid silicone 32a in a container is disposed on the one surface side 21 of the sheet body 20 and as illustrated in FIG. 7, the silicone 32a is poured into the hole portions 25.

Figure 8:
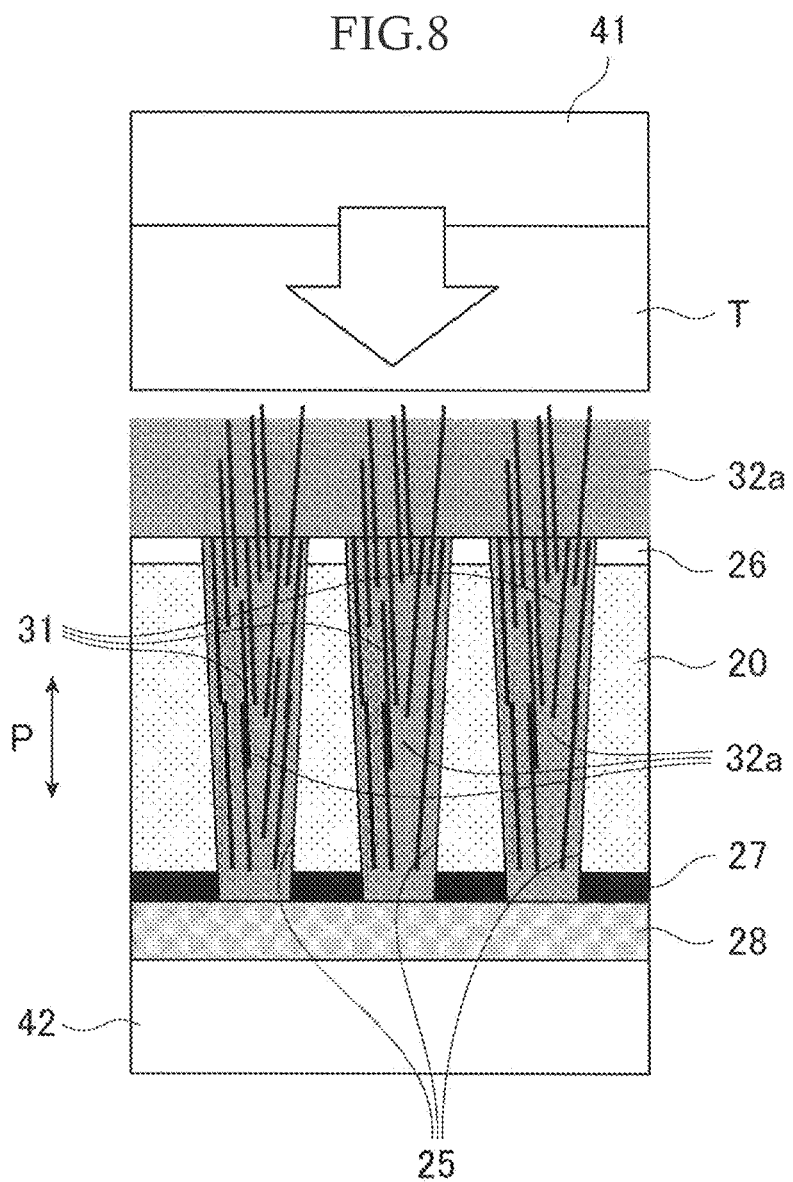
FIG. 8 is a cross-sectional view illustrating the process of manufacturing the anisotropic conductive sheet according to the embodiment.

Next, as illustrated in FIG. 8, the liquid silicone 32a is pressurized from the upper side of the container of the liquid silicone 32a by, e.g., a pressurization tool T and is cured in such state.

Figure 11:
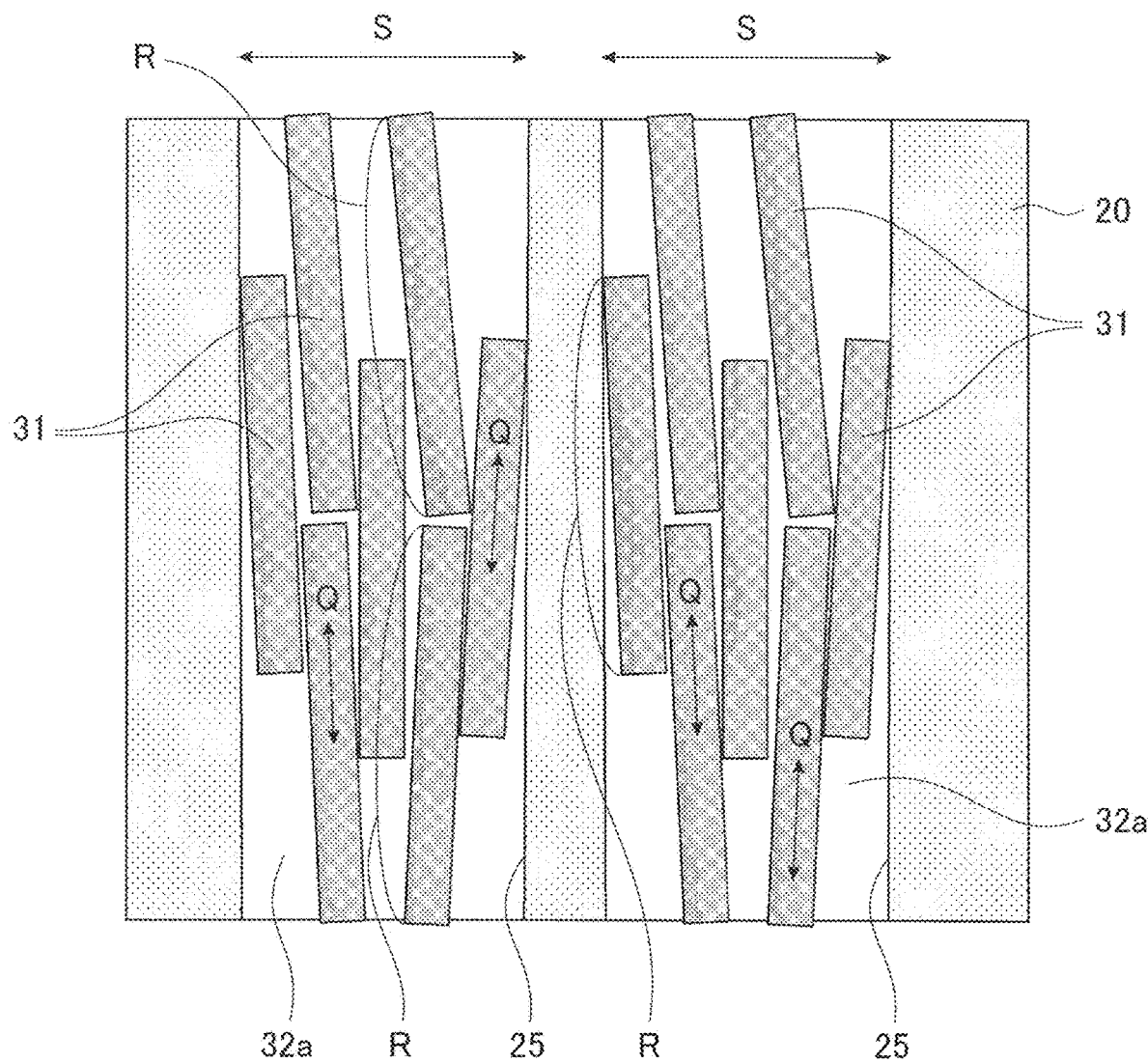
FIG. 11 is a cross-sectional view illustrating a state before application of a magnetic force in the process of manufacturing the anisotropic conductive sheet according to the embodiment.
Figure 12:
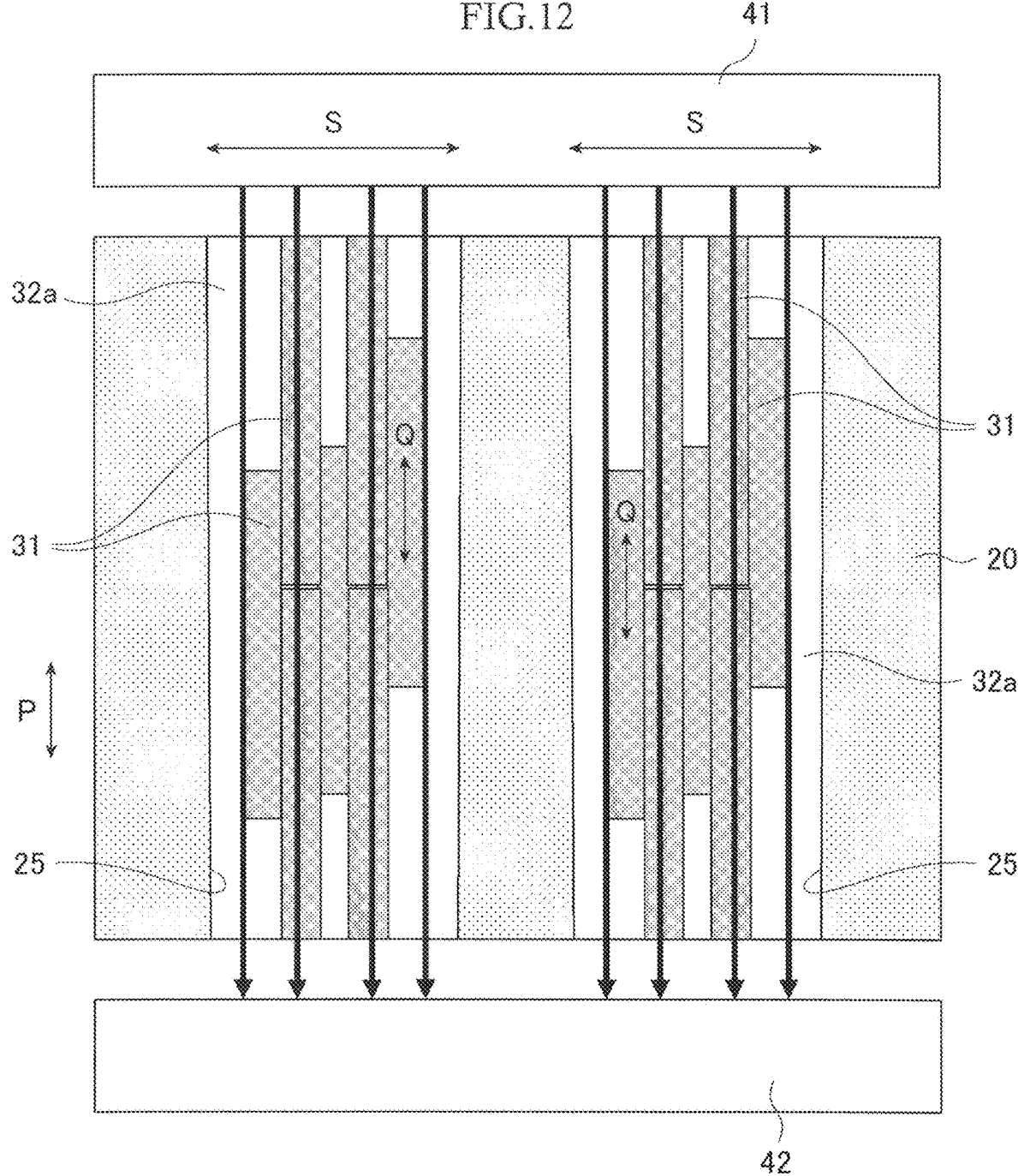
FIG. 12 is a cross-sectional view illustrating a state after application of a magnetic force in the process of manufacturing the anisotropic conductive sheet according to the embodiment.

At this time, as illustrated in FIG. 12, magnetic force generators 41, 42 such as electromagnets are provided on an upper side of the pressurization tool T and the adhesive sheet 28, respectively, so that a magnetic force is continuously applied in a penetration direction P until curing of the pressurized liquid silicone 32a is completed, whereby like the transition from the state in FIG. 11 to the state in FIG. 12, the longitudinal directions Q of the plurality of conductive fibrous members 31 covered by the silicone 32a in each hole portion 25 are ordered more in the penetration direction P and concurrently, the conductive fibrous members 31 are made to stick to one another by the magnetic force.

Consequently, the conductive fibrous members 31 are more favorably electrically connected to one another and the one surface side 21 can be electrically connected to the other surface side 22 via a small number of contacts Z. Note that in order to simply illustrate a manner in which the longitudinal directions Q of the conductive fibrous members 31 are directed to the penetration direction P when a magnetic force is applied, FIG. 12 is a diagram illustrating the conductive fibrous members 31 extending extremely along the penetration direction P; however, the longitudinal directions Q of the conductive fibrous members 31 are not necessarily directed to the penetration direction P so extremely, but the longitudinal directions Q of the conductive fibrous members 31 may be directed to directions that are substantially the same as the penetration direction P.

Figure 9:
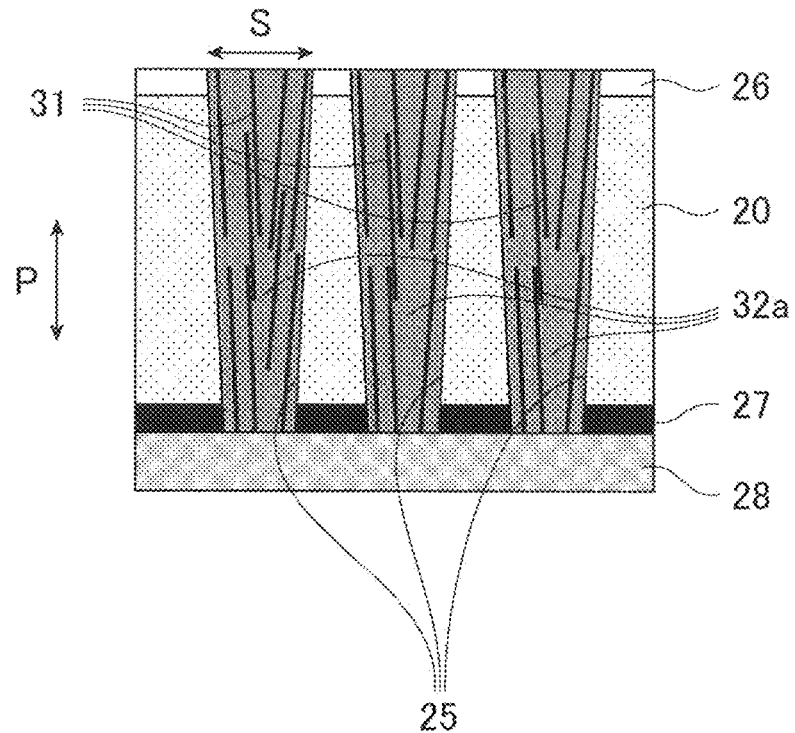
FIG. 9 is a cross-sectional view illustrating the process of manufacturing the anisotropic conductive sheet according to the embodiment.
Figure 10:
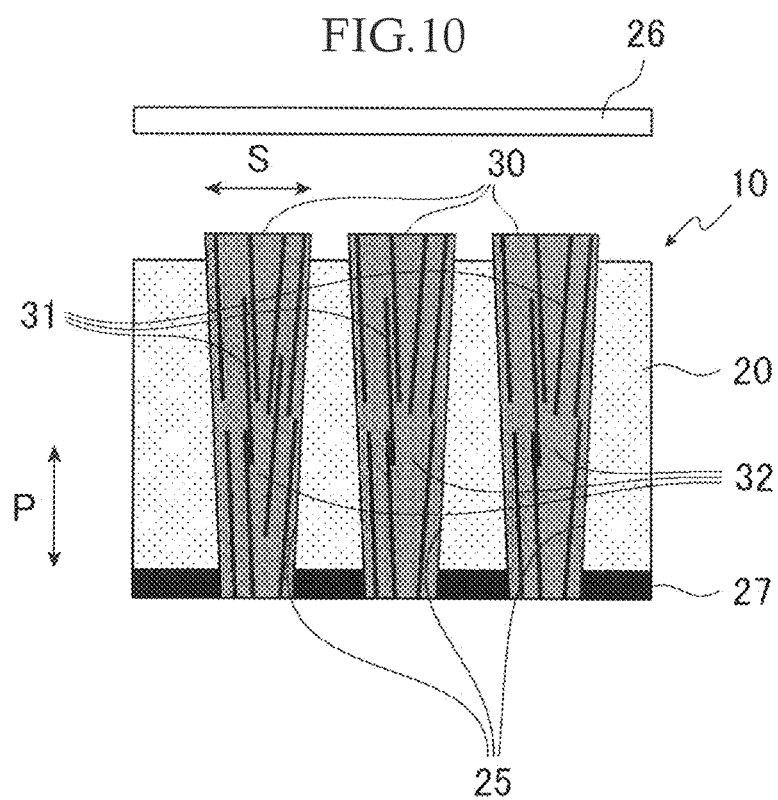
FIG. 10 is a cross-sectional view illustrating the process of manufacturing the anisotropic conductive sheet according to the embodiment.

Subsequently, upon the silicone 32a being cured, as illustrated in FIG. 9, the excess silicone 32a in an upper portion is cut out using a predetermined tool, and as illustrated in FIG. 10, an anisotropic conductive sheet 10 with a plurality of conductive portions 30 formed therein, the plurality of conductive portions 30 each including the plurality of conductive fibrous members 31 encased and held by a resin 32, is removed from the adhesive sheet 28 and the resin film 26 on the one surface side 21 of the sheet body 20 is peeled off. Consequently, the anisotropic conductive sheet 10 that includes a small number of contact points Z between the conductive fibrous members 31, enables electrical resistance from the one surface side 21 to the other surface side 22 of each conductive portion 30 to be suppressed to be low and includes the conductive portions 30 formed therein, the conductive portions 30 each having an elastic force in the penetration direction P can be obtained.

Next, an operation when a test of the IC package 1 is conducted using the anisotropic conductive sheet 10 according to the embodiment will be described with reference to FIGS. 13 and 14.

First, the anisotropic conductive sheet 10 is placed at a predetermined position on the substrate 6. Here, the placement is performed so that the conductive portions 30 on the other surface side 22 of the sheet body 20 of the anisotropic conductive sheet 10 abut right on the contacts 8 provided so as to face upward on a substrate body 7 of the substrate 6.

Next, the IC package 1 is disposed at a predetermined position in the anisotropic conductive sheet 10. Here, the terminals 3 provided so as to face downward on the package body 2 is disposed so as to abut right on the conductive portions 30 in the receiving portion 23 of the one surface side 21 of the sheet body 20 of the anisotropic conductive sheet 10. Consequently, the IC package 1 and the substrate 6 are electrically connected via the anisotropic conductive sheet 10.

Next, power is applied under predetermined set conditions. At this time, in each of the conductive portions 30 between the IC package 1 received on the one surface side 21 of the anisotropic conductive sheet 10 and the substrate 6 provided on the other surface side, the longitudinal directions Q of the plurality of conductive fibrous members 31 are directed to respective directions that are substantially the same as the penetration direction P of the penetration between the one surface side 21 and the other surface side 22 and the plurality of conductive fibrous members 31 are in contact with one another.

Figure 14:
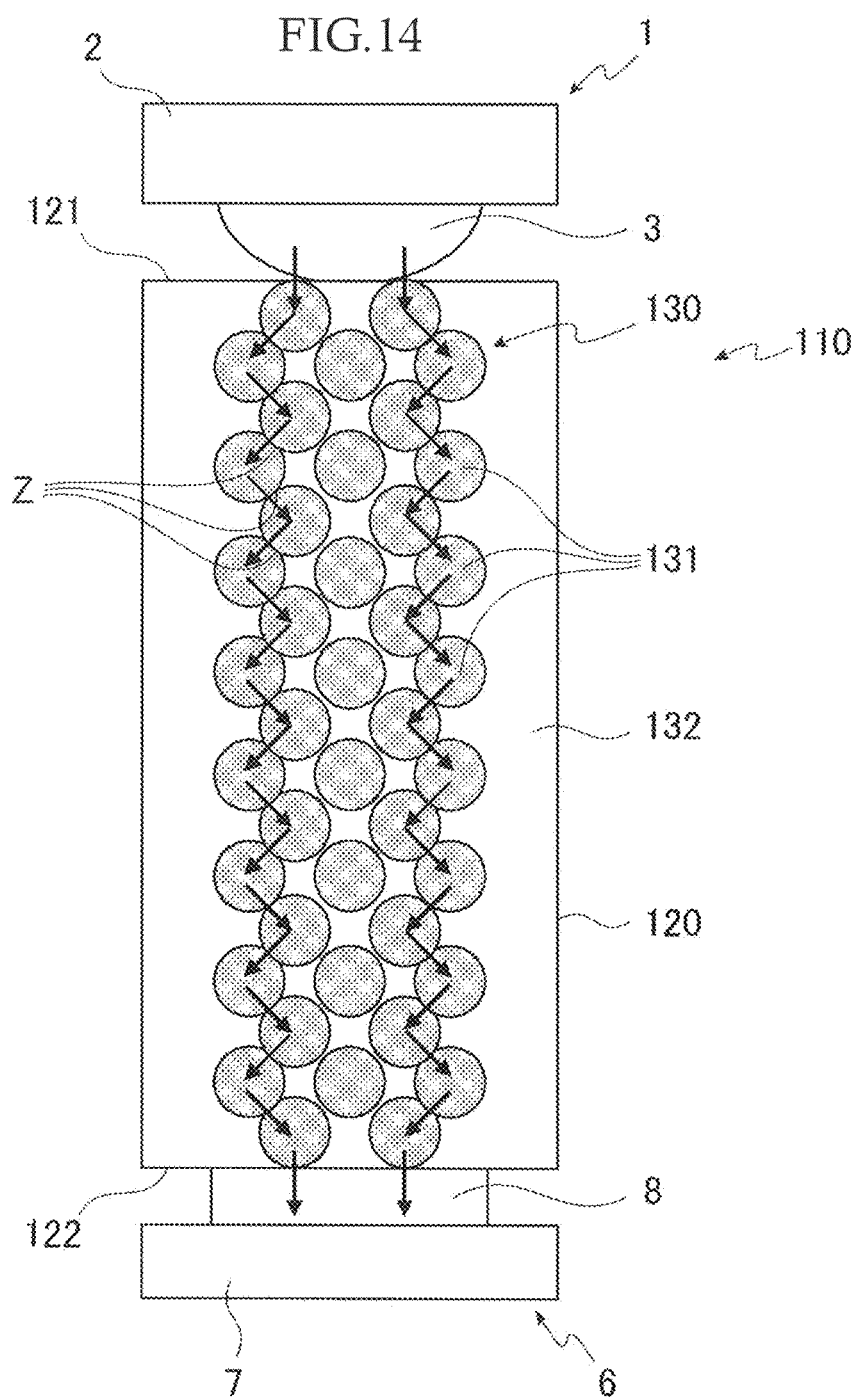
FIG. 14 is a cross-sectional view illustrating a state of contact points between metal grains in a conventional anisotropic conductive sheet.

Consequently, in comparison to the number of contact points Z between the metal grains 131 of each conventional conductive portion 130 with the metal grains 131 packed therein, which is illustrated in FIG. 14, as illustrated in FIG. 13, the one surface side 21 and the other surface side 22 can be electrically connected via a very small number of contact points Z between the conductive fibrous members 31. As result of the decrease in number of contact points Z, electrical resistance at the contact points Z can be suppressed to be small.

As described above, in the anisotropic conductive sheet 10 according to this embodiment, each of the plurality of conductive portion 30 includes the plurality of conductive fibrous members 31, and in the plurality of conductive fibrous members 31 in the conductive portion 30, the longitudinal direction Q of each conductive fibrous member 31 is along a direction that is substantially the same as the penetration direction P of the penetration between the one surface side 21 and the other surface side 22 of the sheet body 20 and the conductive fibrous members 31 are in contact with one another, providing electrical connection from the one surface side 21 toward the other surface side 22, enabling the number of contact points between the conductive fibrous members 31 when the one surface side 21 and the other surface side 22 are electrically connected, to be suppressed to be small and enabling a route for applying power from the one surface side 21 to the other surface side 22 to be linear and short. As a result, electrical resistance from the one surface side 21 to the other surface side 22 of each conductive portion 30 can be suppressed to be low.

Also, in the anisotropic conductive sheet 10 according to this embodiment, the plurality of conductive fibrous members 31 are inserted in each of the plurality of hole portions 25 provided in the sheet body 20 and form a conductive portion 30, and thus, the conductive portions 30 with electrical resistance suppressed to be low can be provided by the simple configuration.

Also, in the anisotropic conductive sheet 10 according to this embodiment, the length R in the longitudinal direction Q of each conductive fibrous member 31 is longer than the diameter S of each hole portion 25, enabling prevention of the trouble of the conductive fibrous members 31 falling down sideways in each hole portion 25 and the longitudinal directions Q of the conductive fibrous members 31 failing to be directed to the penetration direction P of each hole portions 25. As a result, the longitudinal directions Q of the conductive fibrous members 31 are reliably directed to the penetration direction P of the hole portion 25, enabling the number of contact points between the conductive members between the one surface side 21 and the other surface side 22 to be suppressed to be small and enabling a route for applying power from the one surface side 21 to the other surface side 22 to be linear and short.

Also, in the anisotropic conductive sheet 10 according to this embodiment, the plurality of conductive fibrous members 31 that are in contact with one another are encased and thereby held by the resin having an elastic force and form an elastic body having an elastic force in the penetration direction P, thereby forming a conductive portion 30, and thus, contact pressure between the conductive portions 30, and the IC package 1 and the substrate 6 can be secured.

Also, in the method for manufacturing the anisotropic conductive sheet 10 according to this embodiment, as a result of a magnetic force being applied in the penetration direction P of the penetration between the one surface side 21 and the other surface side 22 of the sheet body 20 with the plurality of conductive fibrous members 31 embedded therein, the conductive fibrous members 31 can easily extend along a magnetic force line by means of the magnetic force and the conductive fibrous members 31 can easily be brought into close contact with one another by the magnetic force, facilitating shaping of the conductive portions 30.

Note that although the above embodiment has been described using the IC package 1 as an electric component, the present invention is not limited to this example and an electric component other than an IC package may be used.

Also, although in the above embodiment, in the process of manufacturing the anisotropic conductive sheet 10, a magnetic force is continuously applied in the penetration direction P to cause the plurality of conductive fibrous members 31 to extend along the penetration direction P and cause the conductive fibrous members 31 stick to one another, the present invention is not limited to this example, and depending on conditions such as an amount, a shape, a size and/or an environment in the manufacturing process, of the conductive fibrous members 31, conductive portions 30 in a favorable contact state may be obtained without application of a magnetic force.

Also, although in the above embodiment, the conductive portions 30 are formed by inserting the conductive fibrous members 31 to each of the hole portions 25 formed in the sheet body 20, the present invention is not limited to this example. For example, conductive portions may be formed by continuously applying a magnetic force to parts, in which the conductive portions are to be formed, of a material to form a sheet body, the material being formed of liquid silicone, the sheet body including no hole portion, putting conductive fibrous members into each of the parts, putting the conductive fibrous members together in each of the conduction portions by means of a magnetic force and curing the material. Note that, at this time, as in the above-described embodiment, the conductive fibrous members can be directed to respective directions along a penetration direction of penetration from one surface side to another surface side of the sheet body by applying the magnetic force in the penetration direction.

Also, the materials, the shapes, the sizes, etc., of the respective members including the conductive fibrous members 31 and the conductive portions 30 in the above-described embodiment are not limited to the above examples but may arbitrarily be determined according to, e.g., the respective conditions.

Figure 15:
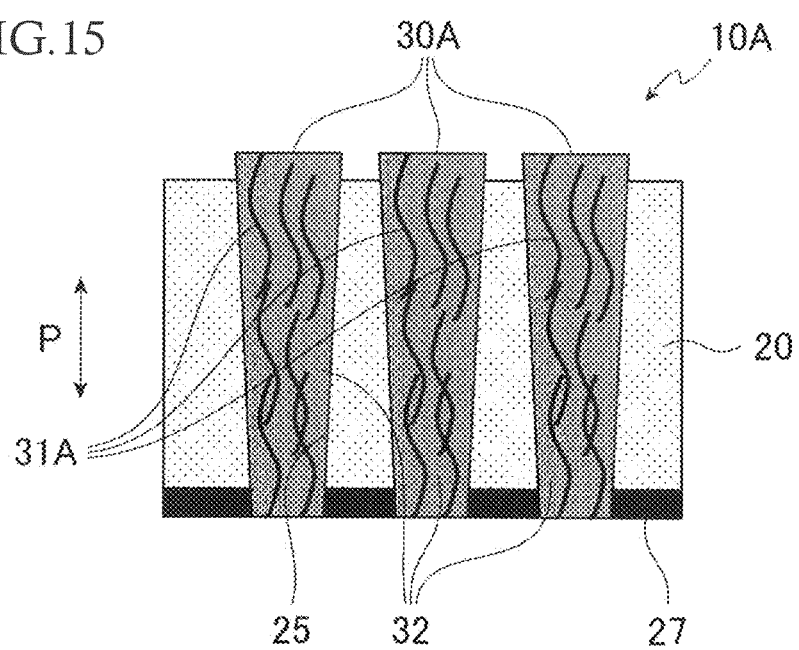
FIG. 15 is an enlarged cross-sectional view of conductive portions in a first alteration of the anisotropic conductive sheet according to the embodiment.

For example, like an anisotropic conductive sheet 10A according to a first alteration, which is illustrated in FIG. 15, there may be a case in which a conductive portion 30A provided in each of a plurality of hole portions 25 formed in a sheet body 20 is one formed by a plurality of conductive fibrous members 31A inserted in the hole portion 25 being encased and held by a resin 32 having an elastic force with the plurality of conductive fibrous members 31A in contact with one another and each of the plurality of conductive fibrous members 31A is formed of a fibrous member obtained by subjecting a wave-like acrylic fiber to nickel plating. Each of the conductive fibrous members 31A has a size and a shape that allow a longitudinal direction of the conductive fibrous member 31A to be directed to a direction that is substantially the same as a penetration direction P of the hole portion 25.

Figure 16:
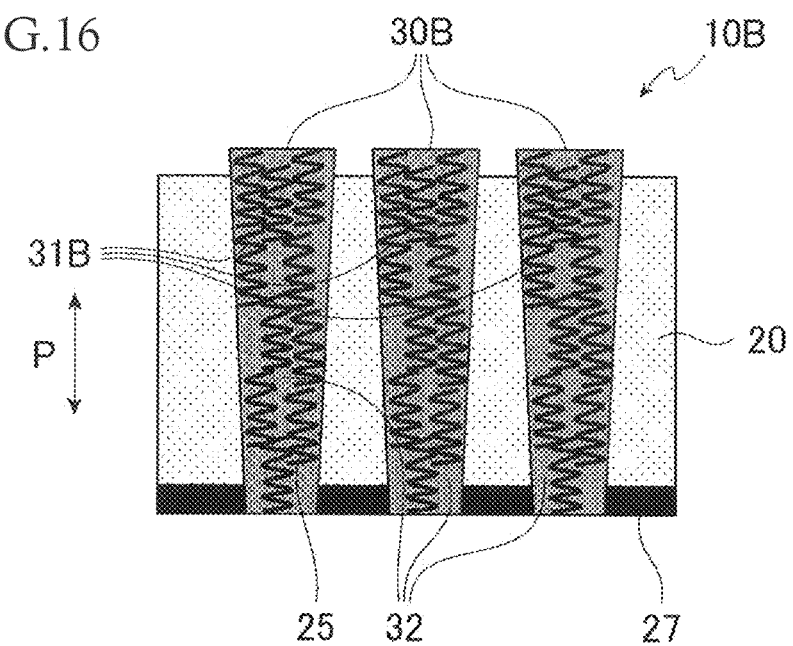
FIG. 16 is an enlarged cross-sectional view of conductive portions in a second alteration of the anisotropic conductive sheet according to the embodiment.

Also, like an anisotropic conductive sheet 10B according to a second alteration, which is illustrated in FIG. 16, there may be a case in which a conductive portion 30B provided in each of a plurality of hole portions 25 formed in a sheet body 20 is one formed by a plurality of conductive fibrous members 31B inserted in the hole portion 25 being encased and held by a resin 32 having an elastic force with the plurality of conductive fibrous members 31B in contact with one another and each of the plurality of conductive fibrous members 31B is formed of a fibrous member having a helical shape, the fibrous member being obtained by subjecting a spring having a predetermined length to nickel plating. Each of the conductive fibrous members 31B has a size and a shape that allow an axial direction of the helical shape to be directed to a direction that is substantially the same as a penetration direction P of the hole portion 25.

Figure 17:
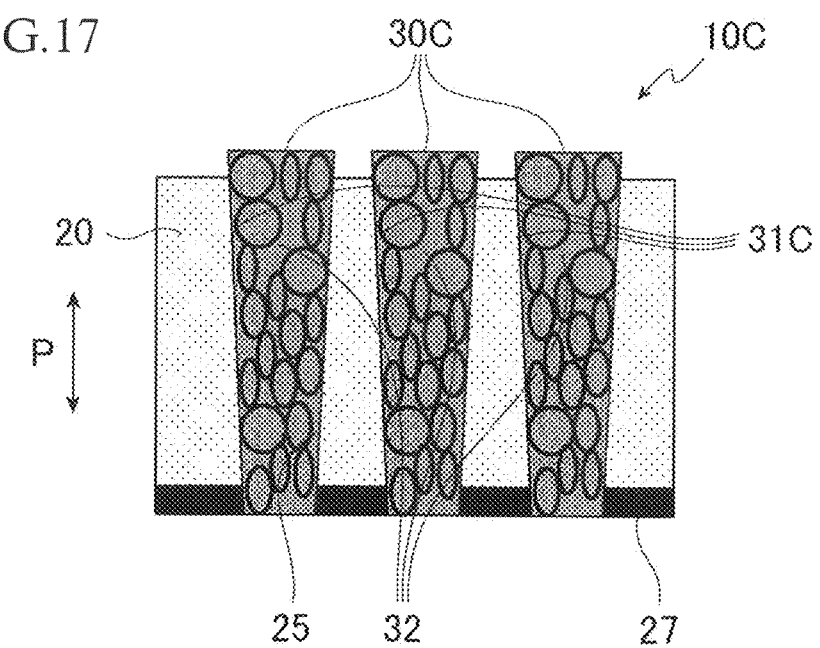
FIG. 17 is an enlarged cross-sectional view of conductive portions in a third alteration of the anisotropic conductive sheet according to the embodiment.

Also, like an anisotropic conductive sheet 10C according to a third embodiment, which is illustrated in FIG. 17, there may be a case in which a conductive portion 30C provided in each of a plurality of hole portions 25 of a sheet body 20 is one formed by a plurality of conductive fibrous members 31C inserted in the hole portion 25 being encased and held by a resin 32 having an elastic force and each of the plurality of conductive fibrous members 31C is formed of a fibrous member having an annular shape, the fibrous member being obtained by subjecting a single-turn spring having a predetermined size to nickel plating. The conductive fibrous members 31C have a size and a shape that allow a diametrical direction of the annular shape is directed to a direction that is substantially the same as a penetration direction P of the hole portion 25 (center axis direction of the annular shape is directed to a direction that is substantially orthogonal to the penetration direction P of the hole portion 25).

REFERENCE SIGNS LIST 10 anisotropic conductive sheet
20 sheet body
21 one surface side
22 other surface side
25 hole portion
30 conductive portion
31 conductive fibrous member
32 resin
41 magnetic body
42 magnetic body
P penetration direction
Q longitudinal direction
R length in longitudinal direction of conductive fibrous member
S diameter of hole portion
Z contact point

The invention claimed is:

1. An anisotropic conductive sheet comprising:
   a sheet body formed of a material having an insulation property, the sheet body having first and second side surfaces opposite to each other, and having a plurality of hole portions that each extend through the sheet body from an opening of the hole portion in the first side surface to an opening of the hole portion in the second side surface with the opening in the first side surface being wider than the opening in the second side surface; and
   a plurality of conductive portions corresponding, respectively, to the plurality of hole portions, wherein
   each conductive portion of the plurality of conductive portions extends in the corresponding hole portion of the plurality of hole portions from the first side surface to the second side surface, and includes a plurality of conductive fibrous members that are in contact with each other, to provide electrical contact through the conductive portion from the first side surface to the second side surface, and
   the plurality of conductive fibrous members included in each conductive portion of the plurality of conductive portions longitudinally extend along a direction that is substantially parallel to a longitudinal axis of the corresponding hole portion of the plurality of hole portions.

2. The anisotropic conductive sheet according to claim 1, wherein each conductive fibrous member of the plurality of conductive fibrous members included in each conductive portion of the plurality of conductive portions longitudinally extends for a length that is longer than a diameter of the corresponding hole portion of the plurality of hole portions.

3. The anisotropic conductive sheet according to claim 2, further comprising, in each hole portion of the plurality of hole portions, a material having an elastic force and forming an elastic body to hold in contact with each other the plurality of conductive fibrous members included in the conductive portion of the plurality of conductive portions that is in the hole portion, so that the conductive portion thereby has an elastic force along a direction that is substantially parallel to the longitudinal axis of the hole portion.

4. The method according to claim 2, wherein each conductive fibrous member of the plurality of conductive fibrous members included in each conductive portion of the plurality of conductive portions longitudinally extends for a length that is longer than a diameter of the corresponding hole portion of the plurality of hole portions.

5. The anisotropic conductive sheet according to claim 1, further comprising, in each hole portion of the plurality of hole portions, a material having an elastic force and forming an elastic body to hold in contact with each other the plurality of conductive fibrous members included in the conductive portion of the plurality of conductive portions that is in the hole portion, so that the conductive portion thereby has an elastic force along a direction that is substantially parallel to the longitudinal axis of the hole portion.

6. A method comprising:
providing an anisotropic conductive sheet including a sheet body formed of a material having an insulation property, the sheet body having first and second side surfaces opposite to each other, and having a plurality of hole portions that each extend through the sheet body from an opening of the hole portion in the first side surface to an opening of the hole portion in the second side surface with the opening in the first side surface being wider than the opening in the second side surface;

inserting a plurality of conductive fibrous members into each hole portion of the plurality of hole portions through the opening of the hole portion in the first side surface;

providing a curable liquid into each hole portion of the plurality of hole portions;

applying, to each hole portion having the plurality of conductive fibrous members and the curable liquid therein, a magnetic force in a penetration direction between the first surface side and the second surface side to cause a longitudinal direction of each conductive fibrous member of the plurality of conductive fibrous members included in each hole portion of the plurality of hole portions to be along the penetration direction and to cause the plurality of conductive fibrous members included in each hole portion of the plurality of hole portions to be brought into contact with one another; and curing the liquid to thereby form a plurality of conductive portions respectively extending in the plurality of hole portions from the first side surface to the second side surface.

* * * * *

UNITED STATES PATENT AND TRADEMARK OFFICE
CERTIFICATE OF CORRECTION

PATENT NO. : 10,720,398 B2
APPLICATION NO. : 16/341308
DATED : July 21, 2020
INVENTOR(S) : Leo Azumi It is certified that error appears in the above-identified patent and that said Letters Patent is hereby corrected as shown below:

In the Claims

Delete Claims 4 through 6, in Column 10, Line 55, through Column 12, Line 17, and replace with the following Claims 4 through 6:

--4. The anisotropic conductive sheet according to claim 1, further comprising, in each hole portion of the plurality of hole portions, a material having an elastic force and forming an elastic body to hold in contact with each other the plurality of conductive fibrous members included in the conductive portion of the plurality of conductive portions that is in the hole portion, so that the conductive portion thereby has an elastic force along a direction that is substantially parallel to the longitudinal axis of the hole portion.

5. A method comprising:
　　providing an anisotropic conductive sheet including a sheet body formed of a material having an insulation property, the sheet body having first and second side surfaces opposite to each other, and having a plurality of hole portions that each extend through the sheet body from an opening of the hole portion in the first side surface to an opening of the hole portion in the second side surface with the opening in the first side surface being wider than the opening in the second side surface;
　　inserting a plurality of conductive fibrous members into each hole portion of the plurality of hole portions through the opening of the hole portion in the first side surface;
　　providing a curable liquid into each hole portion of the plurality of hole portions;
　　applying, to each hole portion having the plurality of conductive fibrous members and the curable liquid therein, a magnetic force in a penetration direction between the first surface side and the second surface side to cause a longitudinal direction of each conductive fibrous member of the plurality of conductive fibrous members included in each hole portion of the plurality of hole portions to be along the penetration direction and to cause the plurality of conductive fibrous members included in each hole portion of the plurality of hole portions to be brought into contact with one another; and Signed and Sealed this
Twenty-third Day of February, 2021

Drew Hirshfeld
*Performing the Functions and Duties of the*
*Under Secretary of Commerce for Intellectual Property and*
*Director of the United States Patent and Trademark Office* curing the liquid to thereby form a plurality of conductive portions respectively extending in the plurality of hole portions from the first side surface to the second side surface.

6. The method according to claim 5, wherein each conductive fibrous member of the plurality of conductive fibrous members included in each conductive portion of the plurality of conductive portions longitudinally extends for a length that is longer than a diameter of the corresponding hole portion of the plurality of hole portions.--